(12) United States Patent
Parker et al.

(10) Patent No.: US 9,478,390 B2
(45) Date of Patent: Oct. 25, 2016

(54) INTEGRATED LIGHT OPTICS AND GAS DELIVERY IN A CHARGED PARTICLE LENS

(71) Applicant: FEI Company, Hillsboro, OR (US)

(72) Inventors: N. William Parker, Hillsboro, OR (US); Marcus Straw, Portland, OR (US); Jorge Filevich, Portland, OR (US); Aurelien Philippe Jean Maclou Botman, Portland, OR (US); Steven Randolph, Portland, OR (US); Clive Chandler, Portland, OR (US); Mark Utlaut, Scappoose, OR (US)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/320,560

(22) Filed: Jun. 30, 2014

(65) Prior Publication Data

US 2015/0380205 A1 Dec. 31, 2015

(51) Int. Cl.
*H01J 37/12* (2006.01)
*H01J 37/22* (2006.01)

(52) U.S. Cl.
CPC .............. *H01J 37/12* (2013.01); *H01J 37/228* (2013.01); *H01J 2237/006* (2013.01); *H01J 2237/31749* (2013.01)

(58) Field of Classification Search
CPC .... H01J 37/26; H01J 37/28; H01J 2237/004; H01J 2237/006
See application file for complete search history.

(56) References Cited

U.S. PATENT DOCUMENTS

| | | | | |
|---|---|---|---|---|
| 5,250,808 A | * | 10/1993 | Danilatos et al. | 250/310 |
| 5,362,964 A | * | 11/1994 | Knowles et al. | 250/310 |
| 5,412,211 A | * | 5/1995 | Knowles | 250/310 |
| 5,591,970 A | * | 1/1997 | Komano et al. | 850/12 |
| 5,851,413 A | * | 12/1998 | Casella et al. | 216/92 |
| 6,182,605 B1 | * | 2/2001 | Frosien | 118/723 EB |
| 6,184,525 B1 | * | 2/2001 | Van Der Mast | 250/310 |
| 6,365,896 B1 | * | 4/2002 | van der Mast | 250/310 |
| 6,590,210 B1 | * | 7/2003 | Essers | 850/9 |
| 6,797,969 B2 | * | 9/2004 | Gerlach et al. | 250/492.3 |
| 6,838,380 B2 | * | 1/2005 | Bassom et al. | 438/680 |
| 6,979,822 B1 | | 12/2005 | Stewart et al. | |
| 7,205,237 B2 | * | 4/2007 | Deering et al. | 438/690 |
| 7,425,708 B2 | * | 9/2008 | Slowko | 250/397 |
| 7,504,182 B2 | | 3/2009 | Stewart et al. | |
| 7,521,687 B2 | * | 4/2009 | Fuse et al. | 250/396 R |
| 7,662,524 B2 | | 2/2010 | Stewart et al. | |
| 7,959,970 B2 | * | 6/2011 | Gaudet et al. | 427/248.1 |
| 8,074,677 B2 | * | 12/2011 | Gold et al. | 137/487.5 |
| 8,183,543 B2 | * | 5/2012 | Platzgummer | 250/492.2 |

(Continued)

FOREIGN PATENT DOCUMENTS

WO 0103145 1/2001

*Primary Examiner* — Nicole Ippolito
*Assistant Examiner* — Sean Luck
(74) *Attorney, Agent, or Firm* — Scheinberg & Associates, P.C.; Michael O. Scheinberg

(57) ABSTRACT

A method and apparatus for directing light or gas or both to a specimen positioned within about 2 mm from the lower end of a charged particle beam column. The charged particle beam column assembly includes a platform defining a specimen holding position and has a set of electrostatic lenses each including a set of electrodes. The assembly includes a final electrostatic lens that includes a final electrode that is closest to the specimen holding position. This final electrode defines at least one internal passageway having a terminus that is proximal to and directed toward the specimen holding position.

23 Claims, 6 Drawing Sheets

(56) References Cited

U.S. PATENT DOCUMENTS

| | | | |
|---|---|---|---|
| 8,242,674 B2* | 8/2012 | Sellmair | 313/160 |
| 8,314,410 B2 | 11/2012 | Straw et al. | |
| 8,319,181 B2 | 11/2012 | Parker et al. | |
| 8,952,328 B2 | 2/2015 | Sluijterman et al. | |
| 2003/0168595 A1* | 9/2003 | Danilatos | 250/310 |
| 2005/0173632 A1* | 8/2005 | Behar et al. | 250/311 |
| 2006/0016988 A1 | 1/2006 | Petrov et al. | |
| 2006/0249674 A1* | 11/2006 | Slowko | 250/305 |
| 2008/0035861 A1* | 2/2008 | Knowles et al. | 250/492.3 |
| 2008/0185509 A1* | 8/2008 | Knowles | 250/251 |
| 2008/0302954 A1* | 12/2008 | Phaneuf et al. | 250/251 |
| 2009/0242763 A1* | 10/2009 | Buijsse | 250/307 |
| 2010/0224780 A1* | 9/2010 | Spruck et al. | 250/309 |
| 2011/0031394 A1* | 2/2011 | Knowles et al. | 250/307 |
| 2011/0068265 A1* | 3/2011 | Arai et al. | 250/306 |
| 2011/0114665 A1 | 5/2011 | Chandler et al. | |
| 2012/0120226 A1* | 5/2012 | de Jonge | 348/80 |
| 2012/0212583 A1* | 8/2012 | Yaguchi et al. | 348/46 |
| 2013/0075604 A1 | 3/2013 | Bean et al. | |
| 2013/0213439 A1* | 8/2013 | Zandbergen et al. | 134/19 |

* cited by examiner

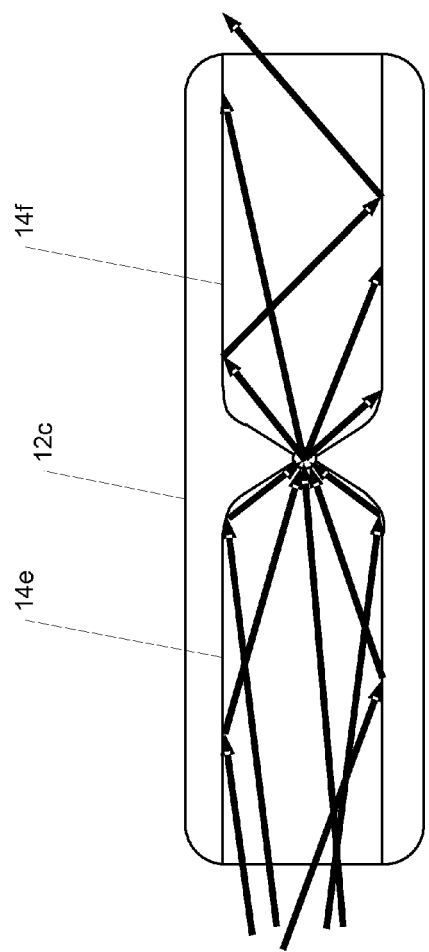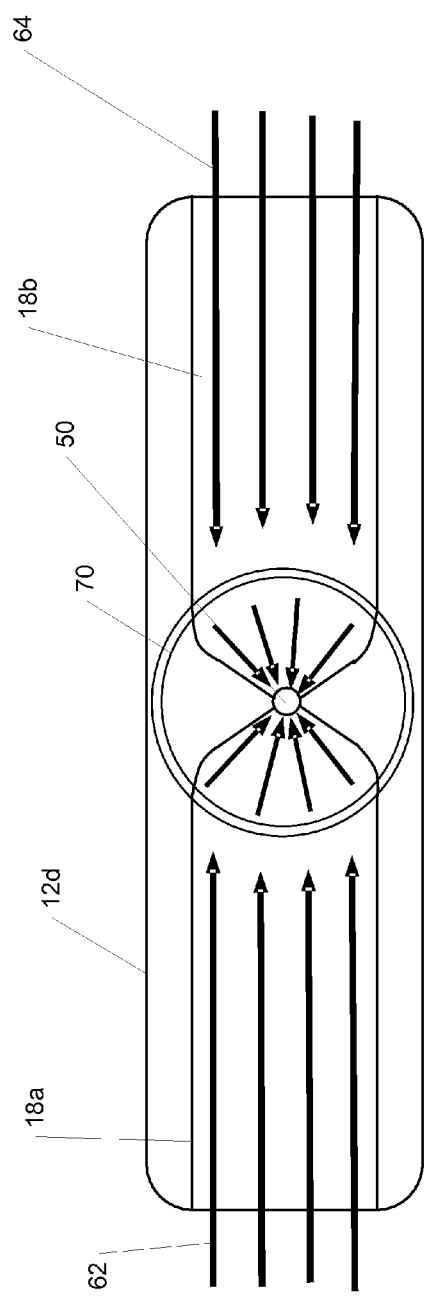

INTEGRATED LIGHT OPTICS AND GAS DELIVERY IN A CHARGED PARTICLE LENS

TECHNICAL FIELD OF THE INVENTION

The present invention relates to charged particle beam column assemblies. More specifically the present invention relates to charged particle beam column assemblies in which the specimen is held within 2 mm of the bottom of the column.

BACKGROUND OF THE INVENTION

A charged particle beam column directs a beam of charged particles to a specimen supported on a stage, for machining or imaging the specimen. Often, two charged particle beam columns are used in tandem (a "dual beam system"), with an electron beam being used for imaging and a focused ion beam being used for machining. Typically, in a dual beam system, there is a gap of at least 13 mm between the lower end of either column and the specimen. This gap permits a light source placed to the side of the column to shine light obliquely on the specimen. Also, one or more gas nozzles can be introduced into the gap, to introduce desired gasses directly toward the specimen.

Recently, it has been perceived that an advantage could be obtained by placing the end of the column much closer to the specimen, and by making the end of the column flat, rather than conical. This design concept, however, prevents gas from being delivered to the specimen because there is no place for a gas nozzle in the small gap between column and specimen. Likewise, light from a light source to the side of the column would be blocked from reaching the specimen, by the bottom of the column. As there are some production techniques that require light or gas or both to be delivered to a specimen, the design concept cannot be practical unless some way is found to deliver these elements to the specimen, despite the presence of the lower end of the column, so close to the specimen.

SUMMARY OF THE INVENTION

This invention comprises a method and apparatus for directing light or gas or both to a specimen positioned within about 2 mm from the lower end of a charged particle beam column. The charged particle beam column assembly includes a platform defining a specimen holding position and has a set of electrostatic lenses each including a set of electrodes. The assembly includes a final electrostatic lens that includes a final electrode that is closest to the specimen holding position. This final electrode defines at least one internal passageway having a terminus that is proximal to and directed toward the specimen holding position. Some embodiments provide more than one passageway, for directing two different gasses to the specimen, or for bringing light both to the specimen, and away from the specimen. In a further embodiment both gas passageways and light passageways are provided. Methods of use include using the passageways to direct light or gas or both to the specimen, and to direct light away from the specimen, during either imaging or machining.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 5 shows a horizontal sectional view of a final electrode of a charged particle beam, showing two broad light passageways, in an alternative to the embodiment of FIG. 4;

FIG. 7 shows a horizontal sectional view of the final electrode shown as part of FIG. 6, also showing the gas passageways.

DETAILED DESCRIPTION OF PREFERRED EMBODIMENTS

Embodiments of the present invention are directed to a charged particle beam column having a final electrode that permits light or gas or both to be directed to or from a specimen.

Figure 1:
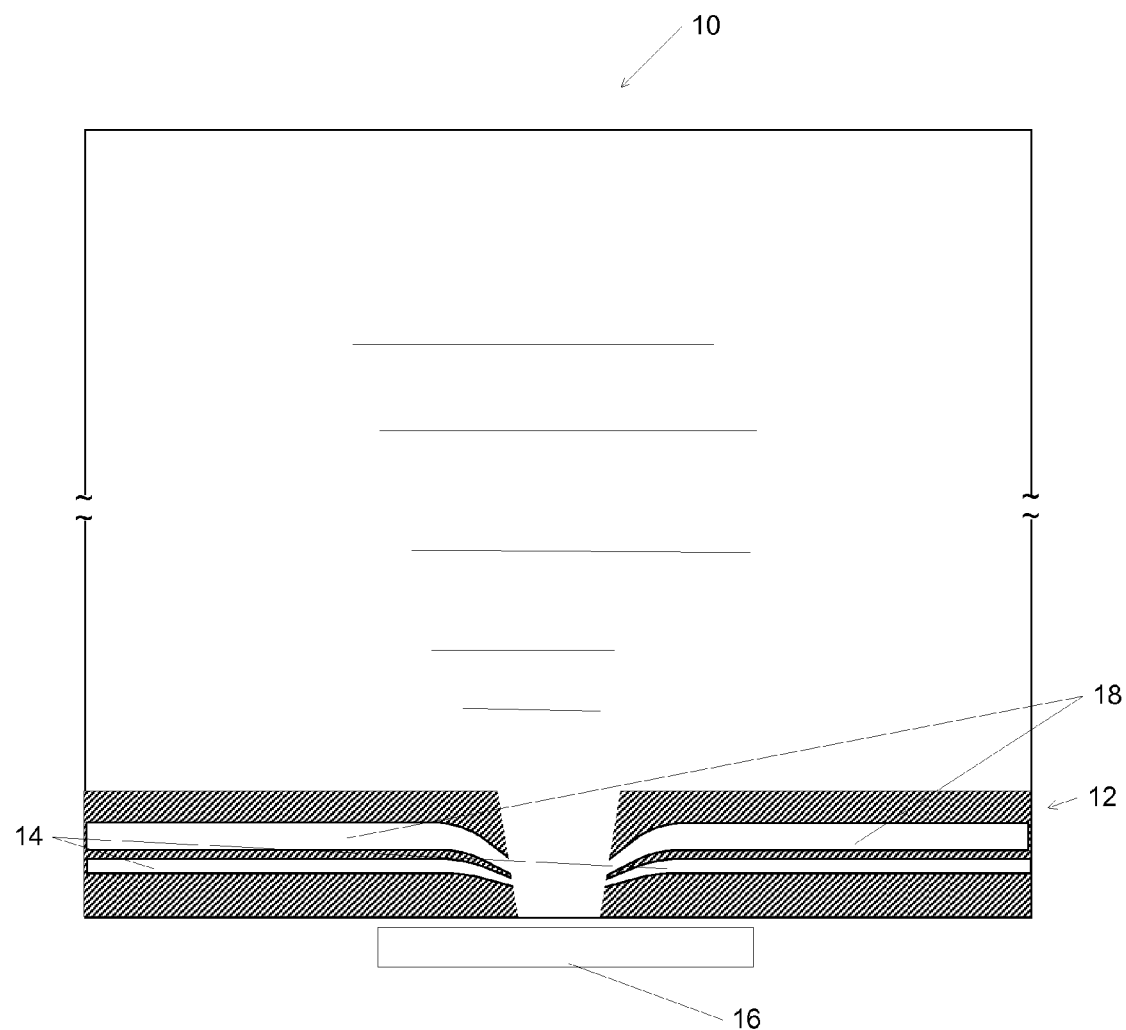
FIG. 1 shows a cut-away view of a focused ion beam column, with the greater extent of the column shown in in general outer form, but with the final electrode of the final lens partially cut-away to be shown in vertical cross-section and vertically expanded view, to reveal passageways.

FIG. 1 shows a cut-away view of a charged particle beam column 10, so that the greater extent of the column 10 is in general outer form, but with the final electrode 12 of the final lens shown in sectional view and having greatly expanded vertical extent relative to rest of column 10, which is shown in truncated form. In broad overview, a charged particle column 10 has a final electrode 12 that has been machined to include a set of passageways 14, for transmitting light to or from a specimen 16, and a separate set of passageways 18, for permitting a gas or two different gasses to be delivered to the specimen 16. As will be detailed further below, more than one passageway may be created in transverse dimension. Also, the light passageways may include light pipes. By bringing light or gas or both to or from specimen 16, through the final electrode 12, it is possible to bring the final electrode within a 2 mm distance of specimen 16, without sacrificing machining or imaging capability.

Figure 2:
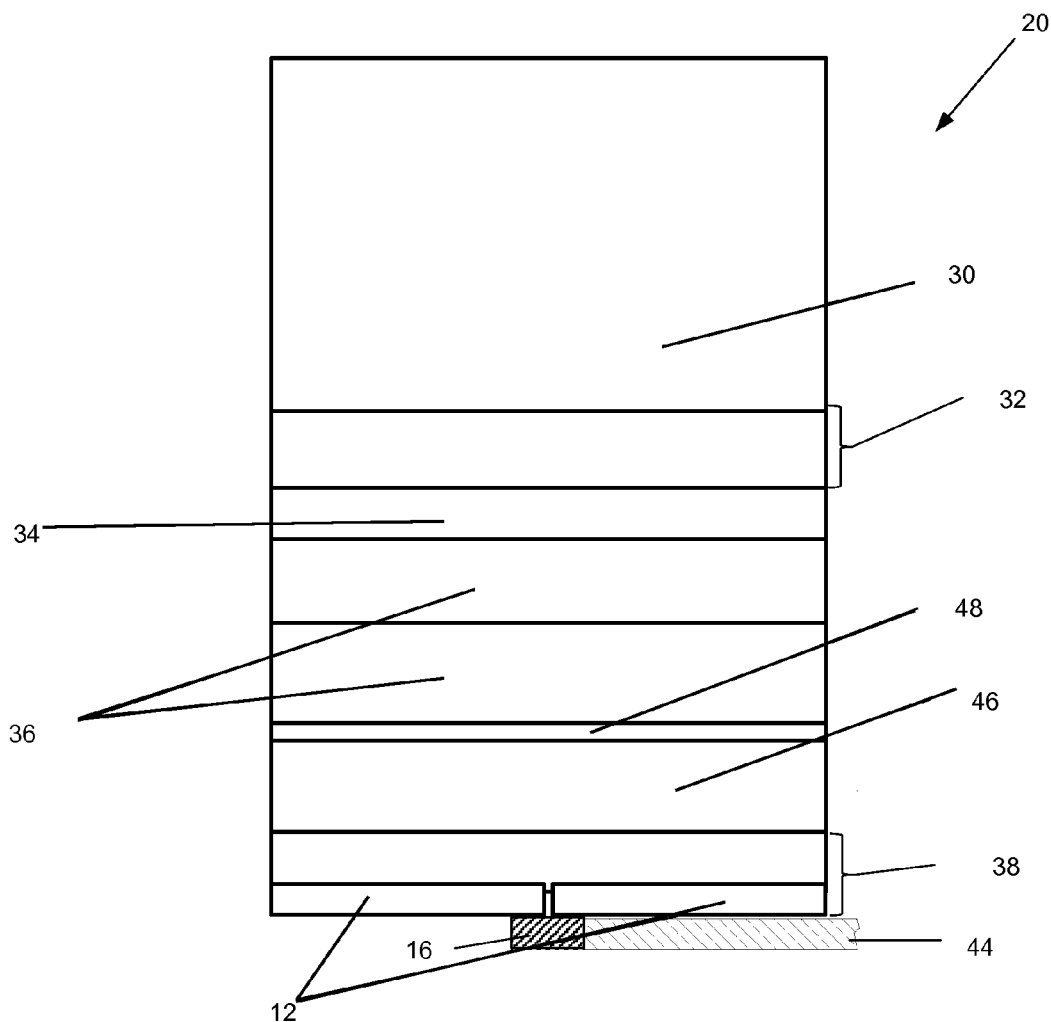
FIG. 2 shows a vertical sectional view of a focused ion beam column, in which embodiments of the present invention could be implemented.

Referring to FIG. 2, which provides context for the embodiments disclosed herein by showing a charged particle beam column 20. A standard Schottky source 30, produces a charged particle stream, which is focused by a gun lens 32, before travelling, when not blanked, through a blanker 34, and a set of deflectors 36. Then, the charged particle beam passes through a main lens 38, which includes a final electrode 12, closest to the specimen. Finally, the beam reaches the specimen position 16, defined by the position of a specimen holder 44. A backscattered electron detector 46 detects higher energy (>50 eV) electrons that are reflected or emitted from the specimen. Likewise a secondary electron detector 48 detects low energy (<50 eV) electrons that are emitted from the specimen.

Figure 3:
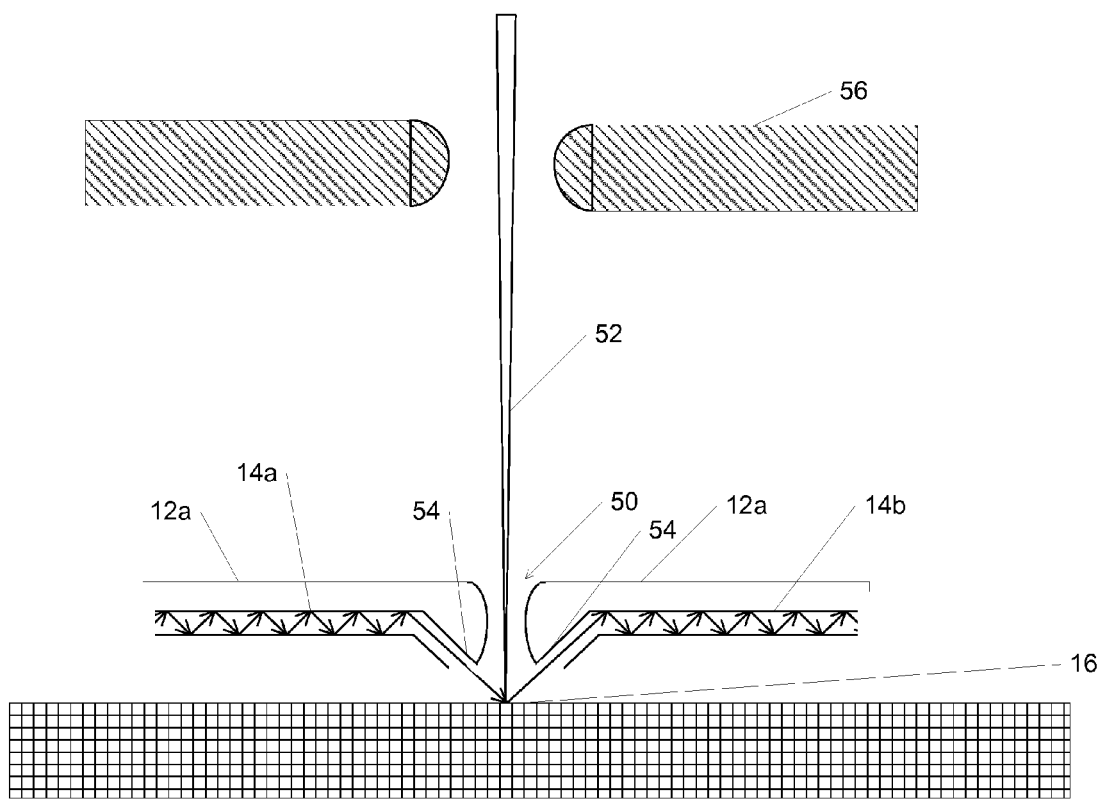
FIG. 3 shows a vertical section view of a bottom portion of a charged particle beam column, showing light passageways, according to an aspect of the present invention.

Referring to FIG. 3, in a preferred embodiment the final electrode 12a defines an aperture 50 that permits the passage of charged particle beam 52, and includes a first light passageway 14a, and a second light passageway 14b. Light passageway 14a is used to transmit light to the specimen position 16, whereas light passageway 14b is used to transmit light away from the specimen, although these roles are not fixed and could be changed. Electrode 12a may be made of metal, and more particularly of a titanium alloy, and in this case light passageways may be void, tubular spaces with polished interior surfaces, so that light can reflect between the surfaces in an intended path. Both light passageways 14a and 14b have a terminus 54 that is proximal to and directed toward the specimen position. The electrode 56 immediately above the final electrode 12a, is also shown. In one preferred embodiment light passageways are light pipes that have been introduced into void spaces created in electrode 12a.

Figure 4:
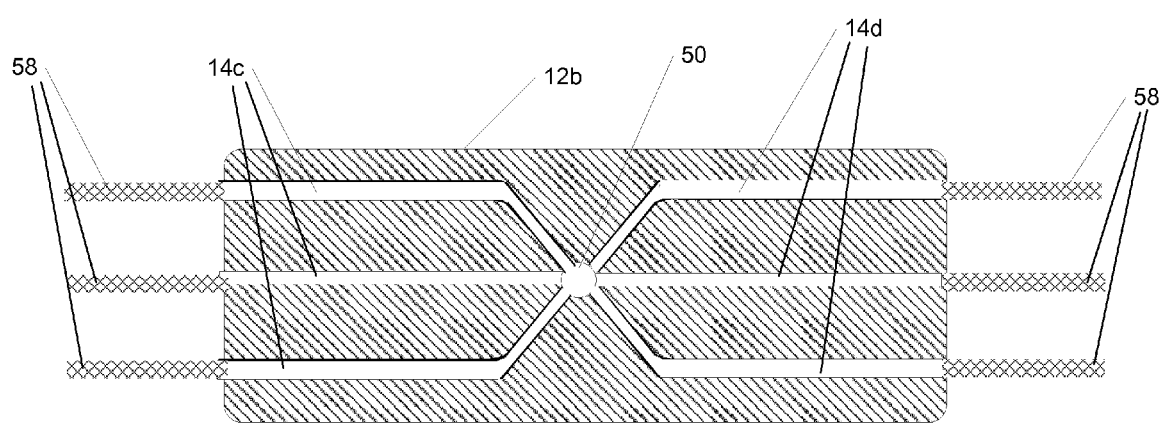
FIG. 4 shows a horizontal sectional view of a final electrode of a charged particle beam, showing multiple light passageways, according to one aspect of the present invention.

Referring to FIG. 4, which is a top view of a final electrode 12b, a set of three generally parallel light paths 14c permit light to travel toward the specimen position 16, while three generally parallel light paths 14d permit light to travel away from the specimen position 16. A set of light pipes 58 transmit light to and from paths 14c and 14d, respectively. Aperture 50 permits the charged particle beam, and the light, to reach the specimen 16 and to be collected from the specimen 16.

Referring to FIG. 5, in an alternative preferred embodiment, a final electrode 12c defines a single, wider pair of light paths 14e and 14f, which transmit light to and from the specimen position 16, respectively. Both passageways 14e and 14f reduce in width as they approach specimen position 16, thereby directing the light toward the specimen. On either side of final electrode 12c a wide light pipe may be used to transmit light to or away from light paths 14e and 14f, respectively.

Figure 6:
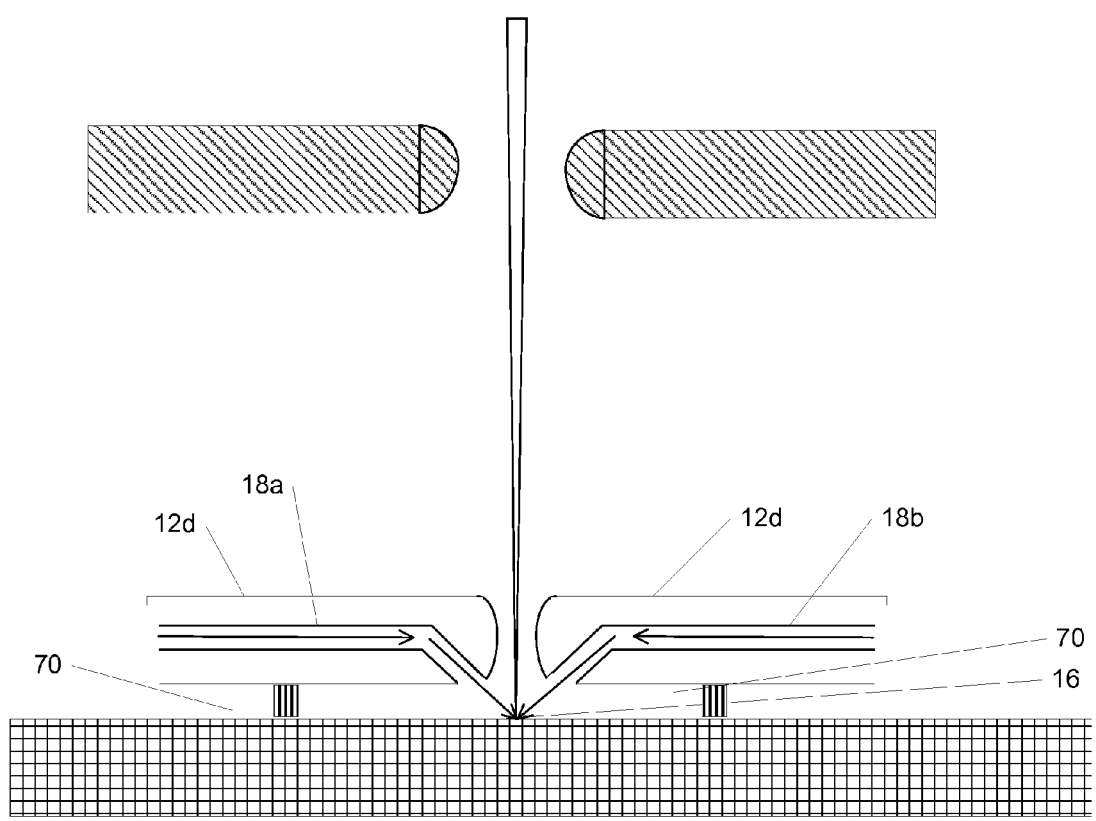
FIG. 6 shows a vertical section view of a bottom portion of a charged particle beam column, showing gas passageways, according to an aspect of the present invention.

FIGS. 6 and 7 illustrate an embodiment in which a final electrode 12d defines first and second gas passageways 18a and 18b, for delivering a first gas 62 and a second gas 64 to the specimen 16, directly beneath aperture 50. A gas containment barrier 70, which is not present in an alternative preferred embodiment, prevents toxic gas from escaping. In an alternative embodiment, nozzles are attached at the openings closest to specimen 16, to more accurately direct the gas to a particular point.

In a further preferred embodiment, any of a passageways 14a-14f may serve as both a gas passageway and a light passageway, either simultaneously, in the event a clear gas is being delivered or in different instances of use.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam column assembly, comprising:
   a) a platform defining a specimen holding position;
   b) an electrostatic lens comprising a set of electrodes including a final plate electrode that is closest to the specimen holding position; and
   c) wherein said final plate electrode defines at least one passageway for transmitting light, the passageway being substantially parallel to the bottom surface of the plate electrode, the light being guided within the passageway in an overall direction parallel to the bottom surface of the plate electrode,
   wherein the passageway is configured to either guide light from a light emitter to the specimen to illuminate the specimen
   or to guide the light illuminated from the specimen to a detector for detecting.

2. The assembly of claim 1, wherein said passageway includes an additional terminus that houses a light detector.

3. The assembly of claim 1, wherein said passageway comprises a first light pathway and wherein said final electrode defines a second light pathway in addition to said first light pathway.

4. The assembly of claim 3, wherein said first light pathway terminates in a light source and said second light pathway terminates in a light detector.

5. The assembly of claim 1, wherein said final plate electrode comprises metal and wherein said internal passageway comprises tubular void space in the metal.

6. The assembly of claim 5, wherein the metal comprises a titanium alloy.

7. The assembly of claim 5, wherein the internal surfaces of the void space are polished to increase reflection.

8. The assembly of claim 1, further comprising a light pipe extending through said internal passageway.

9. The assembly of claim 1, wherein said internal passageway comprises a gas pathway and includes an additional terminus that is connected to a gas source.

10. The assembly of claim 9, wherein said internal passageway is a first gas pathway and wherein said final plate electrode defines a second gas pathway in addition to said first gas pathway.

11. The assembly of claim 10, wherein said first gas pathway terminates in a gas source and said second gas pathway terminates in a gas detector.

12. The assembly of claim 10, wherein said first gas pathway terminates in a first gas source and a said second gas pathway terminates in a second gas source.

13. The assembly of claim 1, wherein said internal passageway comprises both a gas pathway and a light pathway and includes a terminus that communicates with both a gas source and a light source.

14. A method of directing light to or from a predetermined specimen position in a charged particle beam system having an electrostatic lens including a set of electrodes including a final plate comprising:

a) providing a light path to or from the predetermined specimen position through an internal passageway of a final plate electrode, the internal passageway being substantially parallel to the bottom surface of the plate electrode, the light being guided within the internal passageway in an overall direction parallel to the bottom surface of the final plate electrode; and b) emitting light into the light path, wherein the light path is configured to either guide light from a light emitter to the specimen to illuminate the specimen or to guide the light illuminated from the specimen to a detector for detecting.

15. The method of claim 14, further comprising providing an additional light path to the predetermined specimen position; wherein emitting light into the light path comprises directing light to the specimen along the light path; and further comprising receiving light from the specimen through the additional light path.

16. The method of claim 14, wherein said the internal passageway comprises polished surfaces, and wherein said light reflects from said polished surfaces as it travels to or from said specimen.

17. The method of claim 14, wherein the final plate electrode comprises a titanium alloy.

18. The method of claim 14, wherein at least one additional light path is provided and further comprising emitting into the at least one additional light path.

19. The method of claim 14 further comprising directing a gas to the predetermined specimen position through the internal passageway.

20. The method of claim 19, wherein the internal passageway comprises a first gas pathway and wherein the gas is a first gas, and further comprising passing a second gas through a second gas pathway to the predetermined specimen position.

21. The charged particle beam column assembly of claim 1 in which the final plate electrode is positioned within 2 mm of a specimen surface.

22. The charged particle beam column assembly of claim 1 in which the internal passageway is oriented transverse to the axis of the charged particle beam.

23. The charged particle beam column assembly of claim 1 in which the internal passageway is configured so that the light is reflected multiple times as it traverses the passageway.

* * * * *